US006885701B2

(12) United States Patent
Kuwazoe

(10) Patent No.: US 6,885,701 B2
(45) Date of Patent: Apr. 26, 2005

(54) DATA DEMODULATION APPARATUS AND METHOD

(75) Inventor: Yasuyoshi Kuwazoe, Chiba (JP)

(73) Assignee: Sony Corporation, Tokyo (JP)

( * ) Notice: Subject to any disclaimer, the term of this patent is extended or adjusted under 35 U.S.C. 154(b) by 782 days.

(21) Appl. No.: 09/943,362

(22) Filed: Aug. 30, 2001

(65) Prior Publication Data

US 2002/0051505 A1 May 2, 2002

(30) Foreign Application Priority Data

Aug. 31, 2000 (JP) .................................. 2000-264036

(51) Int. Cl.[7] .............................................. H04B 17/00
(52) U.S. Cl. .................... 375/225; 375/262; 375/265; 375/341; 714/795
(58) Field of Search ................................ 375/225, 262, 375/265, 341; 714/792, 794, 795, 796; 370/252

(56) References Cited

U.S. PATENT DOCUMENTS 6,377,618 B1 * 4/2002 Prasad et al. ............... 375/225
6,567,466 B1 * 5/2003 Ovalekar et al. ........... 375/225

FOREIGN PATENT DOCUMENTS

JP 2000 13241 1/2000

OTHER PUBLICATIONS

Okumura Y et al: "Variable–Rate Data Transmission with Blind Rate Detection for Coherent DS–CDMA Mobile Radio" IEICE Transactions on Commuications Institute of Electronics Information and Comm. Eng. Tokyo, JP, vol. E81–B, No. 7, (Jul. 1, 1998), pp. 1365–1372, XP000790169 ISSN: 0916–8516.

"Text proposal for blind rate detection with flexible positions" 3GPP TSG RAN WG1, vol. TSGR1#7(99)d38, (Sep. 3, 1999), XP002248088, Hannover, Germany.

R.E. Blahut: "Theory and Practice of Error Control Codes" 1983, Addison–Wesley, Readings, US XP002248161.

* cited by examiner

Primary Examiner—Stephen Chin
Assistant Examiner—Dac V. Ha
(74) Attorney, Agent, or Firm—Frommer Lawrence & Haug LLP; William S. Frommer

(57) ABSTRACT

The invention provides a data decoding apparatus and method by which the data rate can be discriminated at a high speed using a Viterbi decoding process. Receive data are successively Viterbi decoded beginning with the top thereof. At a point of time when receive data which may possibly be end bit position data required for data rate discrimination are Viterbi decoded, data necessary for the data rate discrimination are successively extracted, and the data rate is discriminated based on the extracted necessary data.

7 Claims, 8 Drawing Sheets

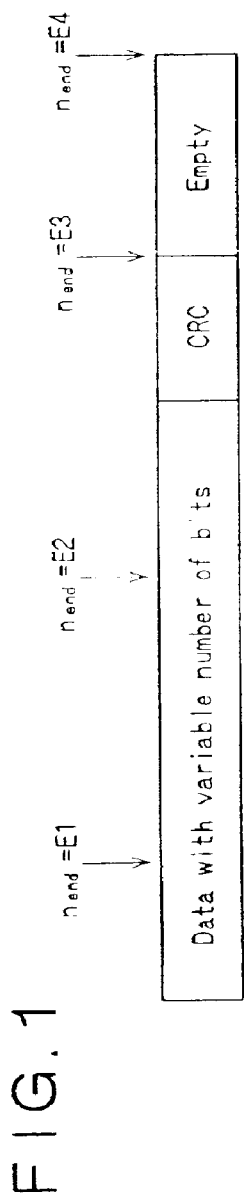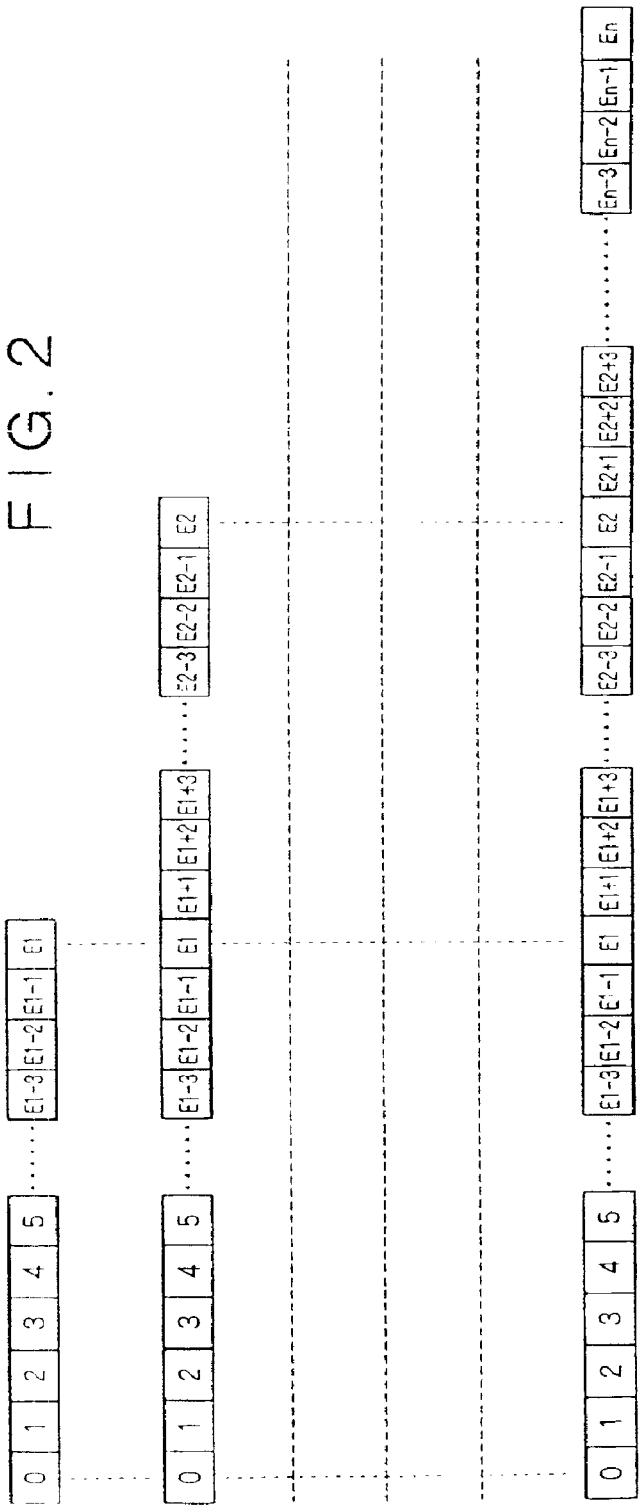

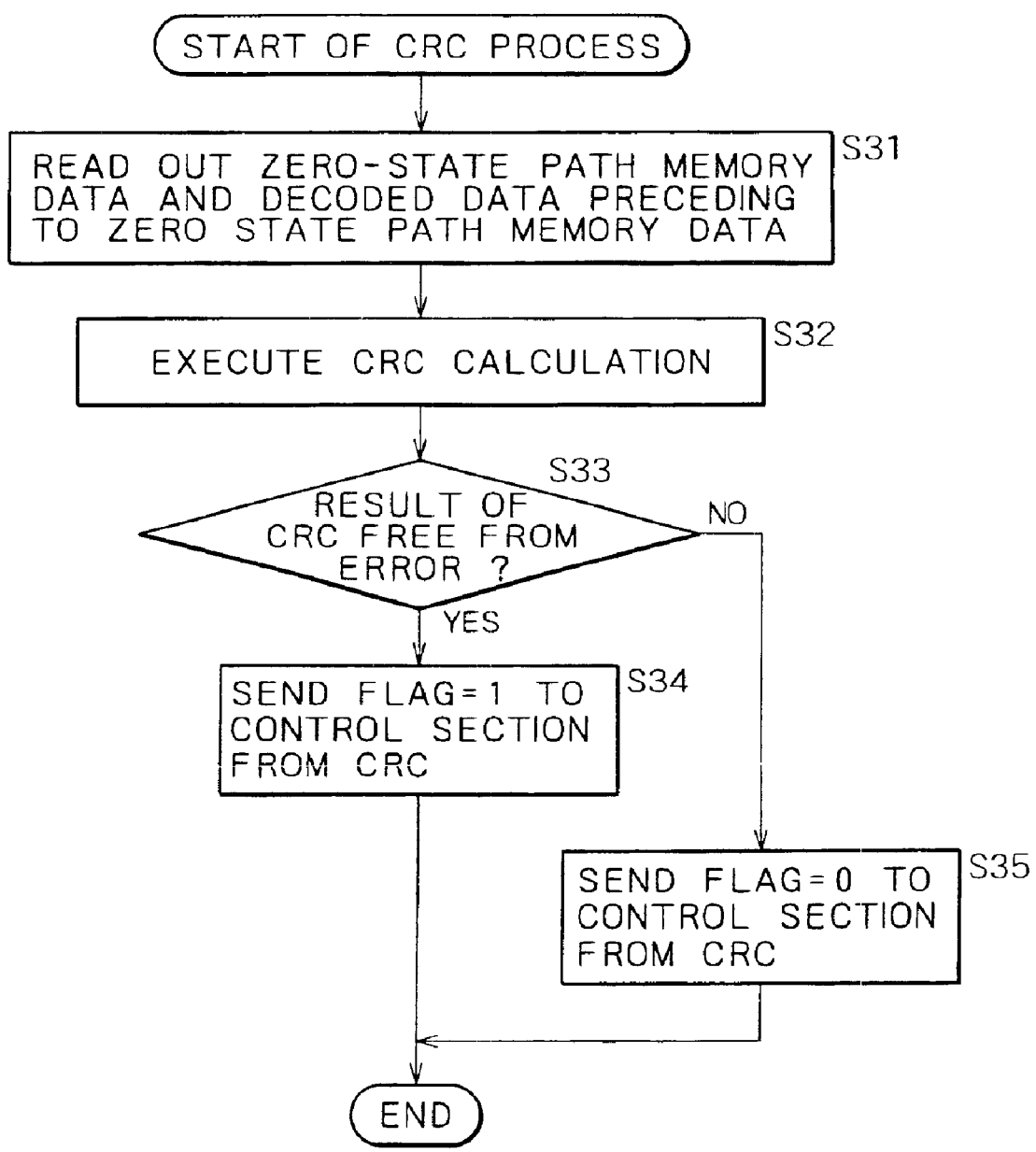

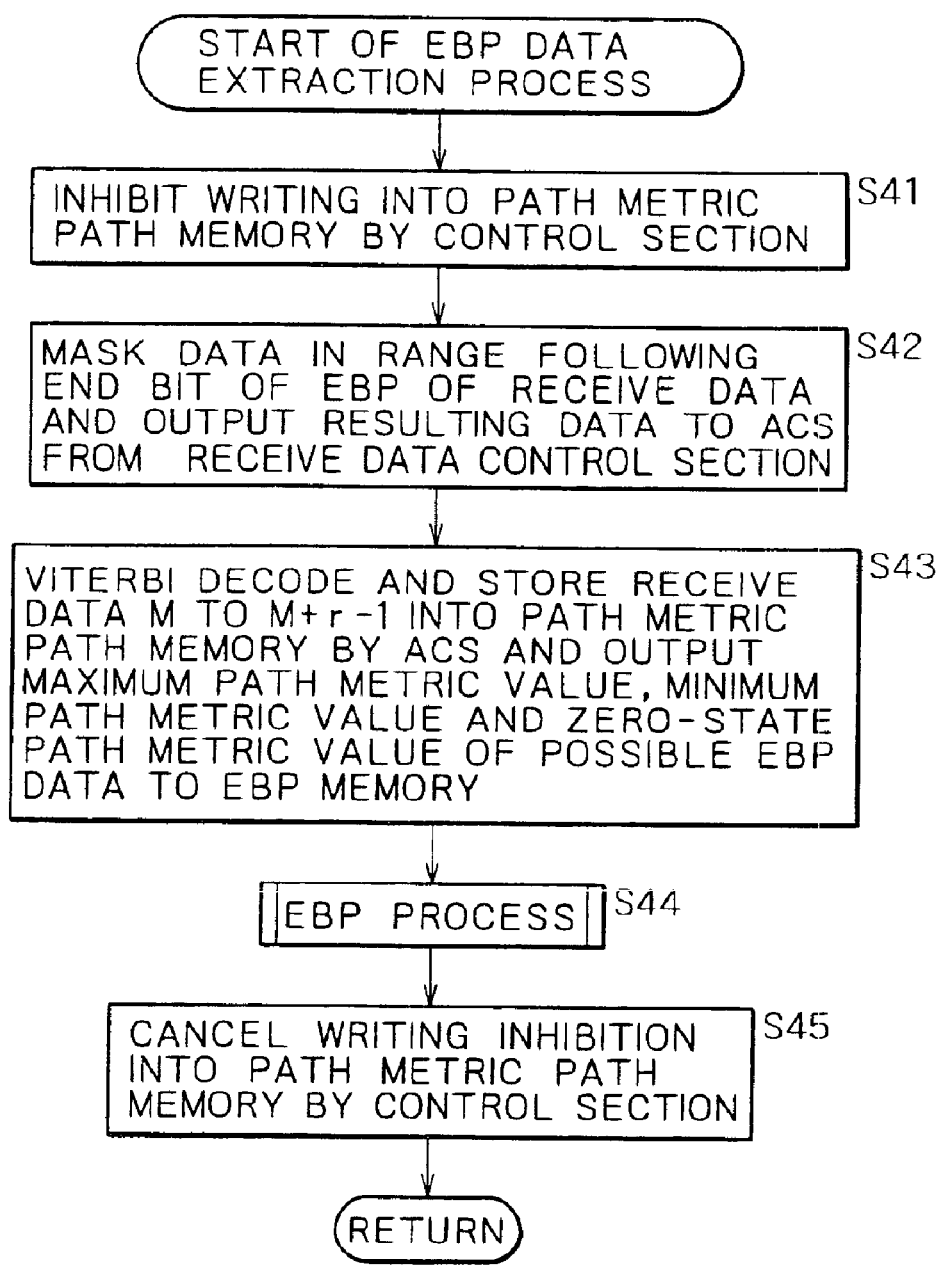

DATA DEMODULATION APPARATUS AND METHOD

BACKGROUND OF THE INVENTION

This invention relates to a data demodulation apparatus and method, and more particularly to a data demodulation apparatus and method which uses a Viterbi decoding process to discriminate the data rate of receive data at a high speed.

A data rate communication method called blind transport format detection is known as one of data rate discrimination methods for a communication system in which a plurality of data rates are used.

According to the blind transport format detection, the data rate is discriminated in the following manner.

In particular, a data demodulation apparatus in a communication system in which a plurality of data rates are used cannot recognize the data rate at a point of time at which it receives data. More particularly, the number of possible data rates is prescribed in advance, and therefore, the data demodulation apparatus recognizes such possible data rates, but cannot recognize which one of the data rates is actually used by the receive data. Therefore, the data demodulation apparatus Viterbi decodes the received data and determines a maximum path metric value, a minimum path metric value and a zero-state path metric value for each data of the end bit position $n_{end}$ which may possibly be the end of an amount of data corresponding to the data rate as counted from the top of the receive data. Then, the data demodulation apparatus calculates the S value (a value represented by a function $S(n_{end})$) given by the following expression (1):

$$S(n_{end})=10 \log\left(\left(\left(a_0(n_{end})-a_{min}(n_{end})\right)/\left(\left(a_{max}(n_{end})-a_{min}(n_{end})\right)\right)\right)\right) \quad (1)$$

where $a_{max}(n_{end})$ is the maximum path metric value at the end bit $n_{end}$, $a_{min}(n_{end})$ is the minimum path metric value at the end bit $n_{end}$, and $a_0(n_{end})$ is the zero-state path metric value at the end bit $n_{end}$.

If the possible end bit is a true end bit, then the zero-state path metric value $a_0(n_{end})$ exhibits a sufficiently low value, and therefore, the S value given by the expression (1) above has a sufficiently small value (a high value in the negative direction). On the other hand, if the possible end bit is not a true end bit, then the zero-state path metric value $a_0(n_{end})$ cannot assume a sufficiently low value, and therefore, the S value does not have a small value.

Thus, making use of the relationship just described, the S value calculated with regard to a predetermined end bit $n_{end}$ is compared with a predetermined threshold value D. Then, if the relationship given by the following expression (2) is not satisfied, then it is discriminated that the end bit $n_{end}$ is not a true end bit, and the S value of another end bit is determined.

$$S(n_{end}) \leq D \quad (2)$$

where the initial value of the threshold value D is set to a comparatively high value.

On the other hand, if the S value satisfies the expression (2) above, then the data demodulation apparatus executes a CRC (Cyclic Redundancy Check) check from the zero-state path memory data. If the CRC check does not reveal an error, then the data demodulation apparatus sets the S value at the end at the point of time to the threshold value D. This operation is repeated until the end bit $n_{end}$ that has the lowest S value (that is, the data length from the top data to the end bit $n_{end}$) is finally detected as the data rate.

It is assumed that the data demodulation apparatus receives, for example, such receive data as seen in FIG. 1. The receive data of FIG. 1 includes a variable length data part (Data with variable number of bits) 1, a CRC part (CRC) 2, and an empty data part (Empty) 3.

If it is assumed that end bits E1 to E4 may possibly be an end bit $n_{end}$ as seen in FIG. 1, that is, if it is assumed that four data rates from the top (left end in FIG. 1) of the receive data to the end bits E1, E2, E3 and E4 are set in advance, then the data demodulation apparatus determines the S value with regard to each of the end bits E1 to E4 and repetitively compares the S values with the threshold value as described above. In the receive data of FIG. 1, the end bit E3 forms a break of the CRC part and makes a true end bit. Accordingly, the S value exhibits a minimum value at the end bit E3, and as a result, the data length from the top to the end bit E3 of the received data is discriminated as the data rate.

In the blind transport format detection described above, the arithmetic operation of the maximum path metric value $a_{max}(n_{end})$, minimum path metric value $a_{min}(n_{end})$ and zero-state path metric value $a_0(n_{end})$ with regard to each possible end bit involves repetitions of a Viterbi decoding process from the top bit to all end bits which each may possibly be a true end bit.

In particular, for example, referring to FIG. 2, in order to determine the maximum path metric value $a_{max}(E1)$, minimum path metric value $a_{min}(E1)$ and zero-state path metric value $a_0(E1)$ with regard to the end bit E1 in the top stage in FIG. 2, the Viterbi decoding process is performed for each of the bits from the top bit 0 to the end bit E1 in the top stage in FIG. 2.

Meanwhile, in order to determine the maximum path metric value $a_{max}(E2)$, minimum path metric value $a_{min}(E2)$ and zero-state path metric value $a_0(E2)$ with regard to the end bit E2 in the second top stage in FIG. 2, the Viterbi decoding process is performed for each of the bits from the top bit 0 to the end bit E2 in the second top stage in FIG. 2.

If n bit rates are set in advance as seen in FIG. 2, such a Viterbi decoding process as described above is repeated to determine the maximum path metric value $a_{max}(En)$, minimum path metric value $a_{min}(En)$ and zero-state path metric value $a_0(En)$ with regard to each of the end bits E1 to En, and the S values determined based on the thus determined path metric values are compared and the data length from the top bit to the end bit En corresponding to $S_{min}$ is discriminated as the bit rate.

However, if the Viterbi decoding process is executed in accordance with the procedure described above to perform bit rate discrimination, then since a similar Viterbi decoding process must be repeated by a number of times equal to the number of possible end bits, that is, the set number of data rates, much time is required for arithmetic operation to finally detect a true end bit. As a result, the technique described above has a subject to be solved in that much time is required for discrimination of the bit rate.

In order to overcome the subject just described, it is a possible idea to use a plurality of Viterbi decoders such that the above-described Viterbi decoding process is executed parallelly thereby to perform the necessary arithmetic operation at an increased speed. This, however, results in another subject that the apparatus scale is increased and also the cost is increased.

SUMMARY OF THE INVENTION

It is an object of the present invention to provide a data decoding apparatus and method by which the bit rate of receive data can be discriminated at a high speed by a Viterbi decoding process with a simple apparatus configuration.

In order to attain the object described above, according to an aspect of the present invention, there is provided a data demodulation apparatus for receiving data of an arbitrary one of a plurality of data rates and demodulating the receive data making use of blind transport format detection, comprising Viterbi decoding means for successively Viterbi decoding the receive data beginning with the top bit, end bit position discrimination data extraction means for successively extracting end bit position discrimination data which are obtained at end bit positions of the data rates when the receive data are successively Viterbi decoded beginning with the top bit by the Viterbi decoding means, and data rate discrimination means for discriminating the data rate of the receive data based on the end bit position discrimination data successively extracted by the end bit position discrimination data extraction means.

Preferably, the data demodulation apparatus further comprises end bit position discrimination data storage means for storing the end bit position discrimination data successively extracted by the end bit position discrimination data extraction means.

Preferably, the Viterbi decoding means Viterbi decodes a plurality of bits of the receive data in one step.

If a bit of the receive data which may possibly be an end bit position bit is not the last bit of the plurality of bits which are Viterbi decoded in one step by the Viterbi decoding means, then the Viterbi decoding means may first Viterbi decode those of the receive data to be Viterbi decoded in one step from the top of the receive data to the bit which may possibly be an end bit position bit, and then Viterbi decode the remaining one or ones of the receive data up to the last bit of the plurality of bits.

In this instance, the data demodulation apparatus may further comprise Viterbi-decoded data storage means for storing data Viterbi decoded by the Viterbi decoding means, and, if the bit of the receive data which may possibly be an end bit position bit is not the last bit of the plurality of bits which are Viterbi decoded in one step by the Viterbi decoding means, then when the Viterbi decoding means Viterbi decodes those of the receive data to be Viterbi decoded in one step from the top of the receive data to the bit which may possibly be an end bit position bit, the Viterbi-decoded data storage means may be inhibited from storing the Viterbi decoded receive data.

The end bit position discrimination data may include a maximum path metric value, a minimum path metric value, a zero-state path metric value and zero-state path memory data.

With the data demodulation apparatus and method, receive data are successively Viterbi decoded beginning with the top bit. Then, end bit position discrimination data which are obtained at end bit positions of data rates when the receive data are successively Viterbi decoded beginning with the top bit are successively extracted. Finally, the data rate of the receive data is discriminated based on the end bit position discrimination data successively extracted in this manner.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a diagrammatic view illustrating discrimination of a data rate;

FIG. 2 is a diagrammatic view illustrating a conventional Viterbi decoding process;

FIG. 8 is a flow chart illustrating details of a CRC process by the data demodulation apparatus of FIG. 3; and FIG. 9 is a flow chart illustrating details of an EBP data extraction process by the data demodulation apparatus of FIG. 3.

DESCRIPTION OF THE PREFERRED EMBODIMENT

Figure 3:
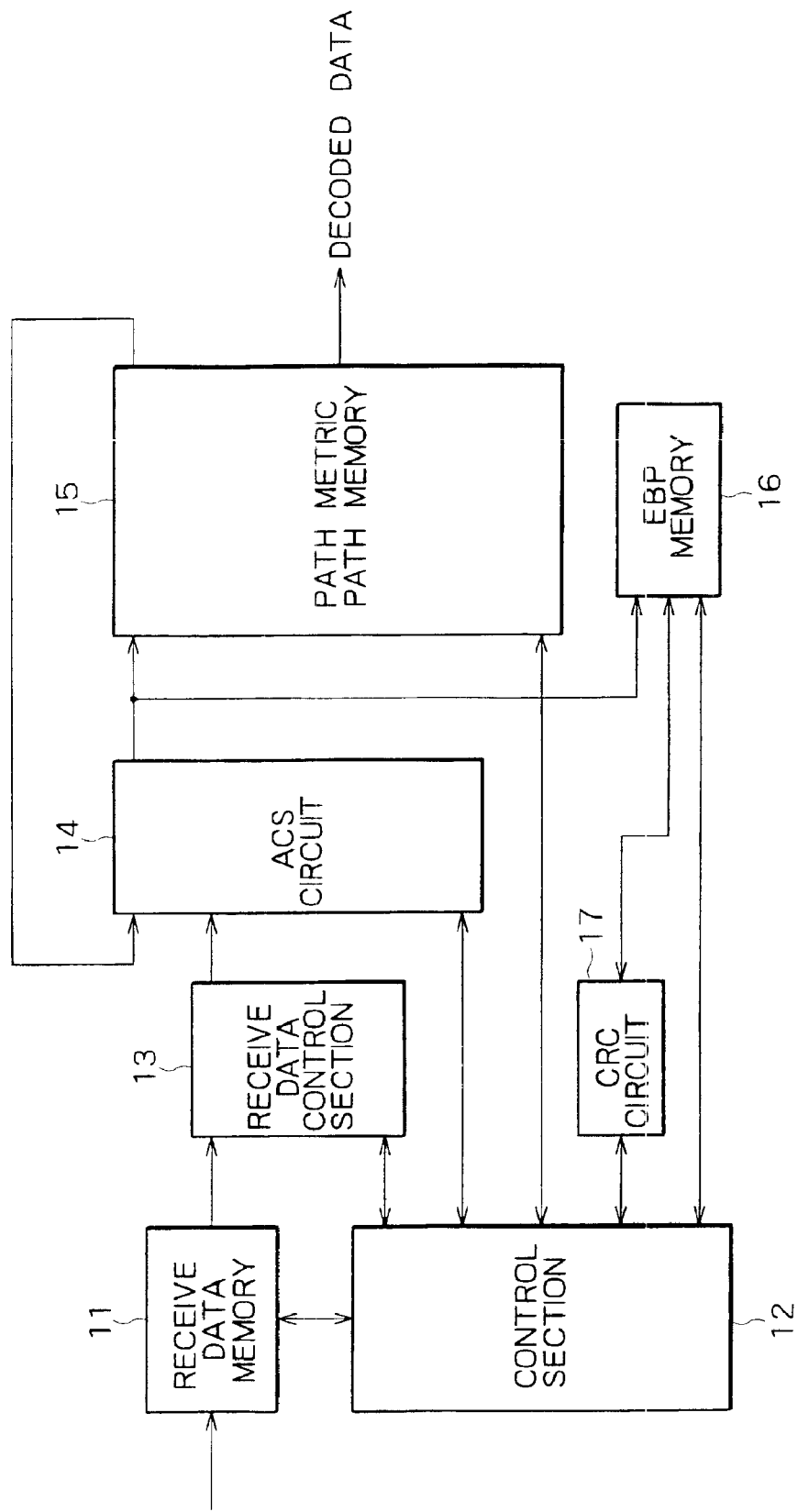
FIG. 3 is a block diagram showing a configuration of a data demodulation apparatus to which the present invention is applied.

Referring to FIG. 3, there is shown a data demodulation apparatus to which the present invention is applied. The data demodulation apparatus shown is employed in a communication system in which a plurality of data rates are used, and discriminates the data rate of receive data, demodulates the receive data at the appropriate data rate and outputs the decoded data to an apparatus of the next stage not shown. To this end, the data demodulation apparatus includes a receive data memory 11 for temporarily storing receive data inputted thereto through an antenna or a demodulator not shown in accordance with an instruction of a control section 12. The receive data memory 11 outputs the stored data for each predetermined number of bits to a receive data control section 13 in accordance with another instruction of the control section 12.

The control section 12 may include a CPU (Central Processing Unit), a ROM (Read Only Memory) and a RAM (Random Access Memory) or logic circuitry all not shown and controls operation of the entire data demodulation apparatus. The control section 12 includes an internal counter not shown, which counts receive data inputted to the receive data memory 11 in a unit of a bit and stores the count value. The control section 12 executes various processes based on the count data of the received data by the built-in counter. The control section 12 further has built therein a counter for the S value described hereinabove and a data rate counter for detecting the data rate.

The receive data control section 13 supplies receive data inputted thereto from the receive data memory 11 to an ACS (Add Compare Select) circuit 14 in accordance with an instruction of the control section 12. Further, when necessary, the receive data control section 13 performs a masking process for receive data (process for changing some of receive data to 0) and supplies resulting data to the ACS circuit 14. The masking process for receive data of the receive data control section 13 is hereinafter described in detail.

The ACS circuit 14 performs such processes as addition, comparison and selection, that is, a Viterbi decoding process, for received data inputted thereto from the receive data control section 13 using processed data stored in a path metric path memory 15 in accordance with an instruction of the control section 12, and outputs a result of the processes so as to be stored into the path metric path memory 15.

Further, the ACS circuit 14 stores EBP (End Bit Position) data, that is, a maximum path metric value, a minimum path metric value, a zero-state path metric value and zero-state path memory data of a bit which may possibly be an end bit displaced by an amount corresponding to the data rate from the top bit of the receive data. It is to be noted that the ACS circuit 14 executes a Viterbi decoding process for a plurality of bits in one step.

The path metric path memory 15 stores Viterbi-decoded data inputted thereto from the ACS circuit 14 in accordance with an instruction of the control section 12. Then, after the data rate is discriminated, the path metric path memory 15 outputs the stored decoded data at the correct data rate to an apparatus of the following stage not shown. Further, the path metric path memory 15 supplies such Viterbi-decoded data as data necessary for Viterbi decoding of next receive data to the ACS circuit 14.

A CRC (Cyclic Redundancy Check) circuit 17 performs CRC calculation, that is, executes a CRC check, using decoded data positioned preceding to zero-state path memory data stored in an EBP memory 16 and zero-state path memory data stored in the path metric path memory 15 to discriminate whether or not the receive data include some errors. The CRC circuit 17 outputs a result of the discrimination as a flag of 0 or 1 to the control section 12.

Figure 4:
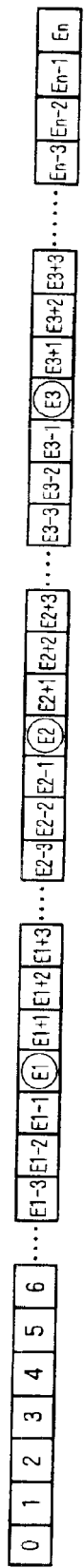
FIG. 4 is a diagrammatic view illustrating receive data.

Now, operation of the data demodulation apparatus where the ACS circuit 14 processes such receive data as illustrated in FIG. 4 three by three bits by Viterbi decoding of one step is described with reference to a flow chart of FIG. 5. It is to be noted that, in the following description, r represents the number of bits which can be Viterbi decoded at a time in one step, and accordingly, in the case just described, r=3. Further, it is assumed that the counter value and the bit number of receive data are equal to each other, and, for example, the bit of receive data corresponding to the counter value M is the bit M (this may be hereinafter referred to as receive data M). Furthermore, those data of the receive data illustrated in FIG. 4 which may possibly be EBP data are each denoted by an encircling mark and represented as receive data E1 to En.

Figure 5:
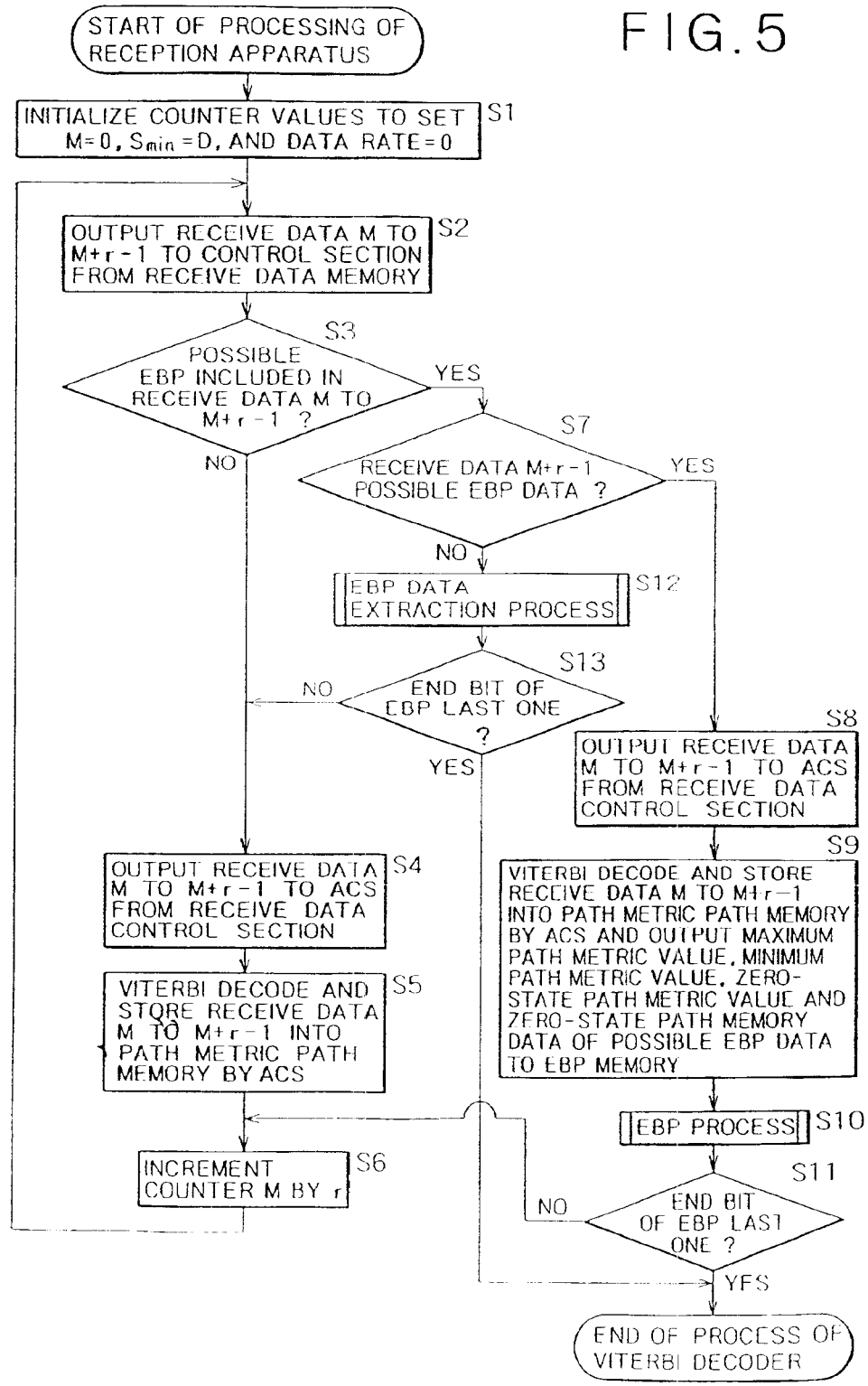
FIG. 5 is a flow chart illustrating a process executed by the data demodulation apparatus of FIG. 3.

Referring to FIG. 5, in step S1, the control section 12 initializes the built-in counters to set the counter M=0, $S_{min}$=D and the data rate=0.

In step S2, the receive data memory 11 stores receive data and outputs receive data M to M+r−1 to the receive data control section 13 in accordance with an instruction of the control section 12. In particular, in the first processing, since the counter value is M=0, the receive data memory 11 outputs receive data 0 to 2 (=0+3−1) illustrated in FIG. 4 to the receive data control section 13.

In step S3, the control section 12 discriminates whether or not the receive data M to M+r−1 include receive data (a bit) which may possibly be EBP data. In particular, in the present case, the control section 12 discriminates whether or not the receive data 0 to 2 include data which may possibly be EBP data. Since the receive data 0 to 2 does not include data which may possibly be EBP data as seen in FIG. 4, the processing advances to step S4.

In step S4, the receive data control section 13 outputs the receive data M to M+r−1 to the ACS circuit 14 in accordance with an instruction of the control section 12. In particular, in the present case, the receive data control section 13 outputs the receive data 0 to 2 to the ACS circuit 14.

In step S5, the ACS circuit 14 Viterbi decodes the receive data M to M+r−1 inputted thereto from the receive data control section 13 and outputs a result of the Viterbi decoding to the path metric path memory 15. Accordingly, in the present case, the ACS circuit 14 Viterbi decodes the receive data 0 to 2 and outputs a result of the Viterbi decoding to the path metric path memory 15.

In step S6, the control section 12 increments the counter value M by r, that is, by 3. Thereafter, the processing returns to step S2.

In step S2, if the counter value is, for example, M=E1−2, then the receive data memory 11 outputs the receive data E1−2 to E1 to the receive data control section 13 in accordance with an instruction of the control section 12.

In step S3, the control section 12 discriminates whether or not the receive data E1−2 to E1 inputted thereto from the receive data memory 11 include receive data which may possibly be EBP data. In the present case, since the receive data E1 may possibly be EBP data, the control section 12 discriminates that data which may possibly be EBP data is present within the range of the receive data E1−2 to E1. Thus, the processing now advances to step S7.

Figures 6A, 6B:
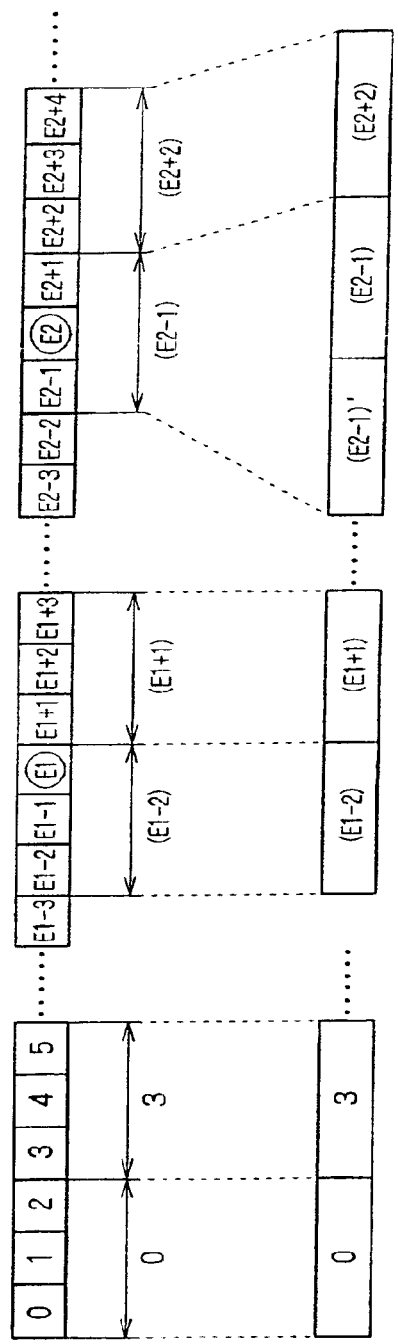
FIGS. 6A and 6B are diagrammatic views illustrating a receive data Viterbi decoding process by the data demodulation apparatus of FIG. 3.

In step S7, the control section 12 discriminates whether or not the receive data M+r−1 is data which may possibly be EBP data. In particular, in step S7, the control section 12 discriminates, when it processes the receive data E1−2 to E1, whether or not the receive data which may possibly be EBP data is the last data (bit) to be Viterbi decoded in one step by the ACS circuit 14 as seen in FIG. 6A. In the present case, the receive data M+r−1 is the receive data E1. The receive data E1 is data which may possibly be EBP data. Accordingly, the processing advances to step S8.

It is to be noted that FIG. 6A is an enlarged view illustrating those of the receive data of FIG. 4 which are in the proximity of the top data and the receive data E1 and E2, and each range indicated by a double-sided arrow mark represents a set of receive data which are to be Viterbi decoded in one step by the ACS circuit 14 when the counter has a count value given below the double-sided arrow mark. Meanwhile, FIG. 6B illustrates processes of the ACS circuit 14 corresponding to the counter values illustrated in FIG. 6A.

In step S8, the receive data control section 13 outputs the receive data M to M+r−1 to the ACS circuit 14 in accordance with an instruction of the control section 12. In the present case, the receive data control section 13 outputs the receive data E1−2 to E1 to the ACS circuit 14. In step S9, the ACS circuit 14 makes use of data, which have been obtained by the Viterbi decoding in the past and are stored in the path metric path memory 15, to Viterbi decode the receive data E1−2 to E1 inputted thereto from the receive data control section 13 and stores a result of the Viterbi decoding into the path metric path memory 15. Further, the ACS circuit 14 stores a maximum path metric value, a minimum path metric value, a zero-state path metric value and zero-state path memory data with regard to the receive data E1 into the EBP memory 16.

In step S10, the control section 12 executes an EBP process.

Figure 7:
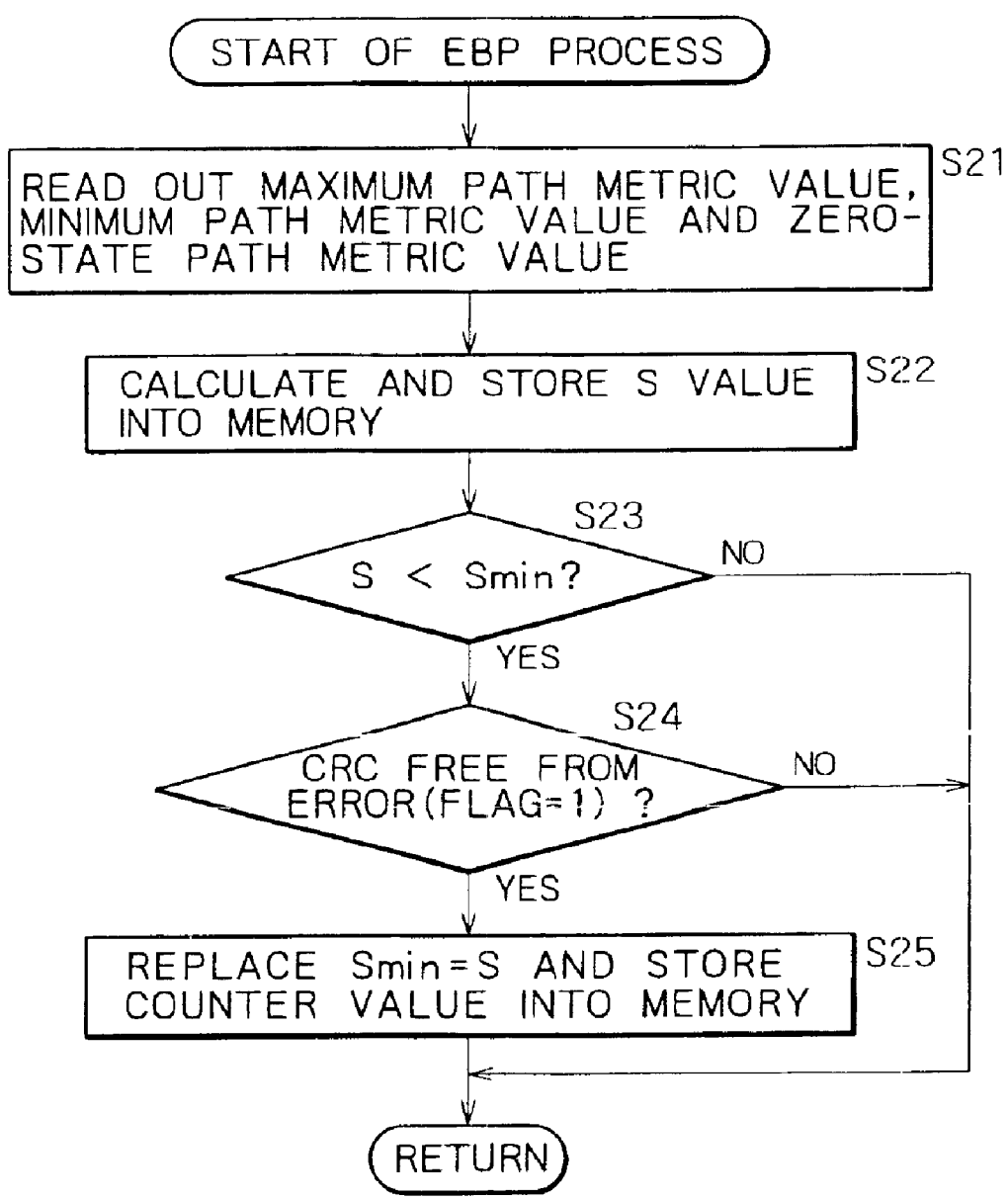
FIG. 7 is a flow chart illustrating details of an EBP process by the data demodulation apparatus of FIG. 3.

The EBP process is described in more detail with reference to a flow chart of FIG. 7.

In step S21, the control section 12 reads out the maximum path metric value, minimum path metric value and zero-state path metric value of receive data, which may possibly be EBP data, from the EBP memory 16. In the present case, the control section 12 reads out the maximum path metric value, minimum path metric value and zero-state path metric value of the receive data E1 from the EBP memory 16.

In step S22, the control section 12 uses the maximum path metric value, minimum path metric value and zero-state path metric value thus read out to calculate the S value in accordance with the expression (1) given hereinabove and stores the S value into the built-in memory thereof.

In step S23, the control section 12 compares the S value just determined by the calculation and a minimum value $S_{min}$ of the S value calculated and stored in the past to discriminate whether or not the relationship of the two is $S<S_{min}$. If a result of the comparison is $S<S_{min}$, then the processing advances to step S24. It is to be noted that an initial value D of the minimum value $S_{min}$ of the S value is a sufficiently high value. Accordingly, usually the S value calculated for the first time is discriminated to be lower than $S_{min}(=D)$.

In step S24, the control section 12 discriminates whether or not the flag supplied from the CRC circuit 17 is 1 which indicates that no error is detected.

Here, processing of the CRC circuit 17 is described with reference to a flow chart of FIG. 8. It is to be noted that the CRC process is executed in parallel to the EBP process of FIG. 7.

In step S31, the CRC circuit 17 extracts the zero-state path memory data stored in the EBP memory 16. In the present case, the CRC circuit 17 reads out the zero-state path memory data of the receive data E1 stored in the EBP memory 16.

In step S32, the CRC circuit 17 executes CRC calculation based on the zero-state path memory data of the receive data E1. In step S33, the CRC circuit 17 compares the CRC value obtained by the CRC calculation with data included in the zero-state path memory data and corresponding to the CRC value to discriminate whether or not the two data coincide with each other (whether or not the receive data includes an error). If the receive data includes no error, then the CRC circuit 17 supplies a CRC calculation result of the flag=1 to the control section 12 (notifies the control section 12 that the receive data does not include an error) in step S34. If the receive data includes an error in step S33, then the CRC circuit 17 supplies a CRC calculation result of the flag=0 to the control section 12 (notifies the control section 12 that the receive data includes an error).

Referring back to FIG. 7, if the flag representing the CRC calculation result is 1 in step S24, that is, if the receive data does not include an error, then in step S25, the control section 12 replaces the minimum value $S_{min}$ of the S value in the built-in memory thereof with the S value just obtained by the calculation to store the S value as the minimum value $S_{min}$ into the built-in memory. Further, the control section 12 discriminates that the length of the received data from the top of the receive data to the receive data E1 is the data rate and sets the data rate counter value to E1, and then stores the counter value into the built-in memory thereof.

On the other hand, if it is discriminated in step S23 that the comparison result is not $S<S_{min}$, then since the S value just calculated is not lower than the minimum value $S_{min}$ of the S value, the data of the end bit of the receive data at the point of time, that is, in the present case, the receive data E1, is discriminated not to be EBP data. Thus, the processing advances to step S11 of the flow chart of FIG. 5.

Further, if it is discriminated in step S24 that the CRC flag inputted from the CRC circuit 17 is 0, then the control section 12 determines that the receive data includes an error. Thus, the processing advances to step S11 of the flow chart of FIG. 5.

Referring back to FIG. 5, in step S11, the control section 12 discriminates whether or not the receive data E1 just processed is the last one (last EBP) of receive data which may possibly be EBP data. If it is discriminated that the receive data E1 is the last one of such receive data, then the processing is ended. However, if it is discriminated that the receive data E1 is not the last one of receive data, then the processing returns to step S6.

For example, if the counter value illustrated in FIG. 6A is E2−1, that is, if the ACS circuit 14 tries to Viterbi decode the receive data E2−1 to E2+1 in one step, then it is discriminated in step S7 that the receive data E2+1 is not receive data which may possibly be EBP data. In other words, since the receive data E2 which may possibly be EBP data is not the last data to be Viterbi decoded in one step by the ACS circuit 14, the processing advances to step S12.

In step S12, the control section 12 executes an EBP data extraction process.

Here, the EBP data extraction process is described with reference to a flow chart of FIG. 9. In step S41, the control section 12 inhibits a write process of the data outputted from the ACS circuit 14 into the path metric path memory 15. In step S42, the control section 12 controls the receive data control section 13 to mask any one of the receive data E2−1 to E2+1 inputted from the receive data memory 11 which follows the receive data E1 which may possibly be EBP data and outputs resulting receive data to the ACS circuit 14. In particular, in the present case, the receive data E2+1 which follows the received data E2 is masked (the value of whose bit is set to 0), and the receive data E2−1 to E2+1 with the receive data E2+1 masked in this manner are outputted to the ACS circuit 14.

In step S43, the ACS circuit 14 Viterbi decodes the receive data E2−1 to E2+1 with the receive data E2+1 masked inputted thereto from the receive data control section 13 using data Viterbi decoded in the past and stored in the path metric path memory 15. Then, the ACS circuit 14 outputs a result of the Viterbi decoding to the path metric path memory 15 and outputs the maximum path metric value, minimum path metric value and zero-state path metric value of the receive data E2 to the EBP memory 16. At this time, since the path metric path memory 15 is in a write-inhibited state, the Viterbi decoding result of the ACS circuit 14 is not stored into the path metric path memory 15.

In step S44, the control section 12 executes an EBP process. The EBP process is similar to the process described hereinabove with reference to the flow chart of FIG. 7, and therefore, overlapping description of it is omitted herein to avoid redundancy.

In step S45, the control section 12 cancels the write-inhibited state of the path metric path memory 15.

Referring back to FIG. 5, in step S13, the control section 12 discriminates whether or not the receive data E2 just processed is the last receive data (last EBP data) which may possibly be EBP data. If the control section 12 discriminates that the receive data E2 is such last receive data, then the processing is ended. However, if the control section 12 discriminates that the receive data is not such last receive data, then the processing returns to step S4.

In this instance, in step S4, the ACS circuit 14 Viterbi decodes the receive data E2−1 to E2+1 (including the receive data E2+1 which is not masked) inputted thereto from the receive data control section 13 making use of data Viterbi decoded in the past and stored in the path metric path memory 15. Then, the ACS circuit 14 outputs a result of the Viterbi decoding to the path metric path memory 15.

In other words, if receive data which may possibly be EBP data is not present at the end of receive data which are Viterbi decoded in one step by the ACS circuit 14 (if data which may possibly be EBP data is present at any other position than the end of the receive data), then the EBP data extraction process, that is, in the present example, a process denoted by (E2-1)' in FIG. 6B, is performed in step S12, and those data preceding to the receive data which is discriminated as EBP data (in the present example, the receive data E2-1 and E2) are Viterbi decoded, whereafter Viterbi-decoded data for the EBP (in the present case, Viterbi-decoded data of the receive data E2) is determined and stored into the EBP memory 16.

Thereafter, in step S4, a process of Viterbi decoding all receive data corresponding to the counter value E2-1, that is, Viterbi decoding the receive data E2-1 to E2+1 (a process denoted by E2-1 in FIG. 6B), is executed. In short, if data which may possibly be EBP data is preset at any other position than the end of those receive data which are to be Viterbi decoded in one step, then a Viterbi decoding process based on receive data corresponding to the same counter value is performed repetitively twice.

In this instance, the reason why writing into the path metric path memory 15 in the first Viterbi decoding process (EBP data extraction process) is inhibited is such as follows. In particular, since the ACS circuit 14 processes receive data inputted thereto from the receive data control section 13 using data Viterbi decoded in the past and stored in the path metric path memory 15, if a Viterbi decoding result based on data obtained by masking that or those of the receive data which is or are present following the receive data which are discriminated as EBP data is used for a Viterbi decoding process in a next step as in the process in step S42 of the flow chart of FIG. 9 (for example, if the data obtained by Viterbi decoding with the receive data E2+1 masked (set to 0) as described above is used for next Viterbi decoding), then an incomplete Viterbi decoding result is used in the Viterbi decoding, and this gives rise to an error. Therefore, in order to obtain a calculation result necessary for a next Viterbi decoding process, the second Viterbi decoding process is executed using the receive data which have not been masked, and a Viterbi decoding result of the second Viterbi decoding process is used in later Viterbi decoding processes.

In the foregoing description, the number of receive data (number of input data) which can be Viterbi decoded in one step by the ACS circuit 14 is 3 bits and the number of data of a result of the decoding is 1 bit. However, the number of receive data and the number of bits of a decoding result may be different bit numbers. For example, the number of receive data may be 4 bits and the number of a decoding result may be 2 bits.

The data demodulation apparatus described above can execute Viterbi decoding processing at a high speed with a simple circuit configuration and therefore can discriminate the data rate of receive data at a high speed.

While a preferred embodiment of the present invention has been described using specific terms, such description is for illustrative purposes only, and it is to be understood that changes and variations may be made without departing from the spirit or scope of the following claims.

What is claimed is:

1. A data demodulation apparatus for receiving data of an arbitrary one of a plurality of data rates and demodulating the receive data making use of blind transport format detection, comprising:

Viterbi decoding means for successively Viterbi decoding the receive data beginning with the top bit;

end bit position discrimination data extraction means for successively extracting end bit position discrimination data which are obtained at end bit positions of the data rates when the receive data are successively Viterbi decoded beginning with the top bit by said Viterbi decoding means; and data rate discrimination means for discriminating the data rate of the receive data based on the end bit position discrimination data successively extracted by said end bit position discrimination data extraction means.

2. A data demodulation apparatus according to claim 1, further comprising end bit position discrimination data storage means for storing the end bit position discrimination data successively extracted by said end bit position discrimination data extraction means.

3. A data demodulation apparatus according to claim 1, wherein said Viterbi decoding means Viterbi decodes a plurality of bits of the receive data in one step.

4. A data demodulation apparatus according to claim 3, wherein, if a bit of the receive data which may possibly be an end bit position bit is not the last bit of the plurality of bits which are Viterbi decoded in one step by said Viterbi decoding means, then said Viterbi decoding means first Viterbi decodes those of the receive data to be Viterbi decoded in one step from the top of the receive data to the bit which may possibly be an end bit position bit, and then Viterbi decodes the remaining one or ones of the receive data up to the last bit of the plurality of bits.

5. A data demodulation apparatus according to claim 4, further comprising Viterbi-decoded data storage means for storing data Viterbi decoded by said Viterbi decoding means, and wherein, if the bit of the receive data which may possibly be an end bit position bit is not the last bit of the plurality of bits which are Viterbi decoded in one step by said Viterbi decoding means, then when said Viterbi decoding means Viterbi decodes those of the receive data to be Viterbi decoded in one step from the top of the receive data to the bit which may possibly be an end bit position bit, said Viterbi-decoded data storage means is inhibited from storing the Viterbi decoded receive data.

6. A data demodulation apparatus according to claim 1, wherein the end bit position discrimination data include a maximum path metric value, a minimum path metric value, a zero-state path metric value and zero-state path memory data.

7. A data demodulation method for a data demodulation apparatus which receives data of an arbitrary one of a plurality of data rates and demodulates the receive data making use of blind transport format detection, comprising:

a Viterbi decoding step of successively Viterbi decoding the receive data beginning with the top bit;

an end bit position discrimination data extraction step of successively extracting end bit position discrimination data which are obtained at end bit positions of the data rates when the receive data are successively Viterbi decoded beginning with the top bit by the process of the Viterbi decoding step; and a data rate discrimination step of discriminating the data rate of the receive data based on the end bit position discrimination data successively extracted by the process of the end bit position discrimination data extraction step.

* * * * *